Aug. 2, 1966 H. R. LEE 3,264,248
ENCAPSULATING COMPOSITIONS CONTAINING AN EPOXY
RESIN, METAXYLYLENE DIAMINE, AND TRIS-BETA
CHLORETHYL PHOSPHATE, AND
ENCAPSULATED MODULES
Filed Aug. 22, 1963
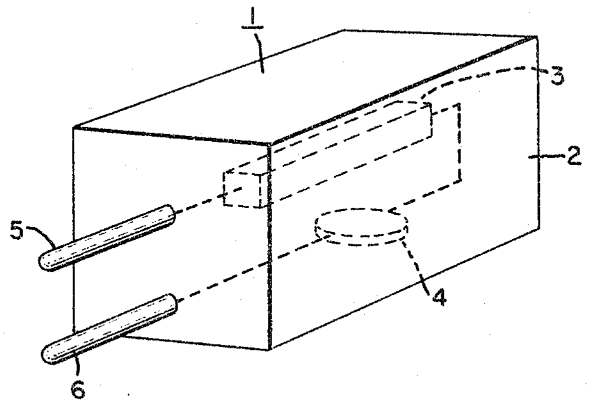
INVENTOR:
HAROLD R. LEE,
BY Walter C. Bernkopf
HIS ATTORNEY.

United States Patent Office 3,264,248
Patented August 2, 1966

3,264,248

ENCAPSULATING COMPOSITIONS CONTAINING AN EPOXY RESIN, METAXYLYLENE DIAMINE, AND TRIS-BETA CHLORETHYL PHOSPHATE, AND ENCAPSULATED MODULES

Harold R. Lee, Auburn, N.Y., assignor to General Electric Company, a corporation of New York Filed Aug. 22, 1963, Ser. No. 304,722
5 Claims. (Cl. 260—30.6)

This application is a continuation-in-part of my application Serial No. 857,216, entitled "Encapsulated Modules," filed December 3, 1959, and now abandoned, and assigned to the same assignee as the present invention.

This invention relates to encapsulated or potted electronic modules; more particularly, it relates to such electronic modules, the potting material of which is clear, has an exotherm upon resinification which is non-destructive of the contained electronic components, which is self-extinguishing, and which is characterized by other desirable physical characteristics, such as good electrical insulating properties and ability to withstand physical abuse.

With the increased development of electronic circuits and components, and the trend toward miniaturization, there has occurred the development of modules containing a number of electronic components such as capacitors, resistors, transistors, and the like, encapsulated in a resinous material, forming a discrete part or all of a particular circuit. Each such module can readily be removed from the electronic assembly of which it is a part and replaced with a minimum of difficulty. The economic advantage of replacing such a complete module containing a number of small or miniature electronic components instead of attempting to repair or replace one of such components in an open or exposed circuit will at once be apparent. Furthermore, the encapsulating resinous material forms a moisture and heat barrier for the components, as well as a heat-transmissible material for carrying heat generated in the components themselves away from the component.

having an epoxide equivalent of from 173 to 205, 14.5 parts metaxylylene diamine, and 8 parts tris-beta chlorethyl phosphate.

Those features of the invention which are believed to be novel are set forth with particularity in the claims appended hereto. The invention will, however, be better understood, and further advantages and objects thereof appreciated, from the consideration of the following description and the drawing, in which the single figure shows a perspective view of a typical electronic module produced according to this invention.

The module 1 comprises a clear resinous material 2 which encapsulates or pots two electronic components 3 and 4 which may be placed in a circuit by utilizing the terminal prongs 5 and 6 projecting from the face of the module. It is apparent that the module shown in the drawing is only representative of those which may be produced utilizing the resin composition of the present invention. Other typical circuit components may contain only one electronic member, or may contain more than two of such members.

The epoxy resins used in connection with this invention are well known in the art. They are described in Castan U.S. Patents 2,324,483 and 2,444,333, British Patent 518,057, and British Patent 579,698. Generally, the ethoxylene resins described herein are the reaction product of an epihalogenohydrin, such as epichlorohydrin and a phenol having at least two phenolic hydroxy groups such as bis-(4-hydroxy phenol)-2,2 propane. U.S. Patents 2,494,295, 2,500,500, and 2,511,913 describe further ethoxylene resins which can be used in conjunction with the invention. The above patents are incorporated herein by reference. The ethoxylene resins used herein have more than one epoxy group per molecule and can generally be prepared by reacting a polyhydroxy alcohol or phenol such as hydroquinone resorcinol, glycerine, and condensation products of phenols, with ketones, for example, bis-(4-hydroxy phenol)-2,2 propane with epichlorohydrin. The reaction of epichlorohydrin with bis-(4-hydroxy phenol)-2,2 propane is as follows:

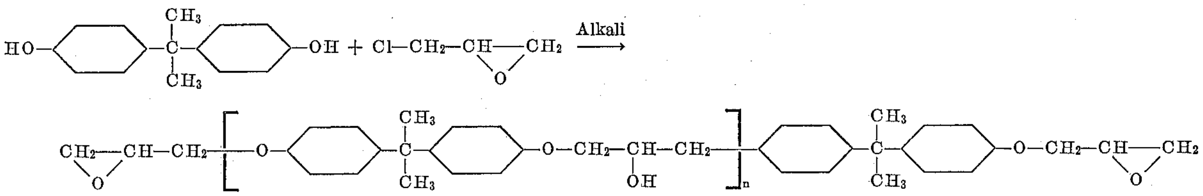

It is required that the resinous encapsulating material be self-extinguishing when exposed to flame, that it be suitably electrically insulating, and that it be able to withstand a substantial amount of mechanical abuse. In many cases, it is further desirable to have a substantially clear or transparent resinous encapsulating material so that the exact position of the components within the module may be observed and checked.

A primary object of this invention is the provision of modules having the characteristics described above and the preparation of a resinous composition for forming such modules.

Briefly stated, the invention comprises modules containing electronic components, said components being encapsulated in an epoxy, epoxide, or ethoxylene type resin composition comprising by weight 100 parts epoxide resin having an epoxide equivalent of from 173 to 205, 13.5 to 15.5 parts metaxylylene diamine, and 7 to 9 parts tris-beta chlorethyl phosphate. An epoxide equivalent is defined as the weight of resin in grams which contains 1 gram chemical equivalent of epoxy. Preferably, the resinous composition comprises 100 parts epoxide resin where $n$ has an average value ranging from 0 to about 8. Such ethoxylene resins are sold under the name of "Epon" by Shell Chemical Corporation, under the name of "Araldite" by the Ciba Company, as "Epi-Rex" by DeVoe-Raynolds Company, as "ERL Resins" by the Bakelite Company, and "DER Resins" by the Dow Chemical Company.

Illustrative of those epoxy resins which may be utilized in the formulation of the present invention are those shown in Table I below:

TABLE I

| Epoxy resin: | Epoxide equivalent |
|---|---|
| Epon 828 | 192 |
| Araldite 6005 | 180–190 |
| Araldite 6010 | 192 |
| Araldite 6020 | 200–205 |
| ERL 2774 | 175–200 |
| Epi-Rex 510 | 175–200 |
| DER 331 | 187–193 |
| DER 332 | 173–179 |
| DER 334 | 178–186 |

It should be noted that each of the resins shown in Table I has an epoxide equivalent in the range of from 173 to 205, and that other epoxy resins having epoxide equivalents within this range may also be utilized in the practice of the present invention. Other well-known epoxy resins which can be used include, but are not limited to, glycerol-based epoxies, epoxidized soya bean oil, cyclohexene oxide-type epoxies, epoxidized olefins, and others.

The only material which has been found which will impart self-extinguishing characteristics to the present resinous compositions, and at the same time permit the retention of other qualities described above, is tris-beta chlorethyl phosphate. Likewise, the only suitable hardening material or curing agent for the epoxy resin has been found to be metaxylylene diamine, which permits the preparation of a substantially clear or transparent composition, while at the same time imparting the other desirable characteristics noted. Particularly, the metaxylylene diamine provides for hardening of the epoxy resin composition at temperatures of about, or slightly above, room temperature, with so little exotherm or emission of heat or raising of temperature as not to damage the electronic components being encapsulated. Temperatures in excess of about 85° C. will normally irreparably damage and detract from the performance of electronic components such as transistors, capacitors, resistors, and the like, which are generally used in such modules.

In addition to the requirement that only specific materials be used in the present invention, the ranges of such materials are very specific and limited, and if departed from, produce a material which is unsuitable. When using a composition containing 100 parts by weight of epoxy resin, if less than about 13.5 parts metaxylylene diamine are used, the module is improperly cured and physically deficient. On the other hand, if more than about 15.5 parts of metaxylylene diamine are used, the exotherm or heat produced during resinification is so great that the electronic components, such as transistors, being encapsulated are likely to be damaged. Furthermore, the excessive amount of curing agent produces a more brittle material which is undesirable from a mechanical point of view. If less than about 7 parts tris-beta chloroethyl phosphate are used, the material has been found not to be self-extinguishing. On the other hand, when more than about 9 parts of this material are used, the resulting composition is lacking in desirable hardness and is physically degraded.

The order and method of mixing the three components of the resinous composition is important in order to insure best results. First, the correct weight of plasticizer or tris-beta chlorethyl phosphate, is added to the weighed resin and blended or mixed thoroughly before the addition of the curing agent, after which addition the mixture is again completely blended. It has been found that if the curing agent, or metaxylylene diamine, is added to the epoxy resin before the plasticizer, there is a tendency toward entrainment of bubbles and development of an off-color as opposed to a substantially clear, water white, final material. If desired, the mixture may be heated for several minutes, for example, up to about five minutes, at a temperature of about 50° C. immediately before it is used for encapsulating purposes. This preheating, which facilitates pouring, of course, depends upon the particular viscosity of the composition used.

The curing of the resinous composition is of a time-temperature nature, i.e., higher temperatures within limits take a shorter time for complete curing, whereas lower temperatures take a proportionately longer time for curing. Generally speaking the present compositions are cured at temperatures of from about 25° to 65° C., for from about two to four hours.

The molds in which the present resinous compositions are used may be formed of any usual material including, but not limited to, various metals, such as steel, aluminum, and the like, resinous materials, such as polytetrafluoroethylene and similar compositions, and various organopolysiloxanes, all of which are well-known in the art. Generally speaking, a post-cure for about one hour to four hours at temperatures ranging from about 50° C. to about 105° C. is advisable after the resinous material has been removed from the mold. Large castings of the order of about 1 to 150 cubic inches can actually be cured at room temperature because of the amount of heat generated by the resinification process. On the other hand, very small castings may require that the mold be preheated somewhat in order to facilitate the curing of the resin, which in smaller amounts gives off a lesser total quantity of heat. Such adjustments are well within the ability of those skilled in the art. Generally speaking, if a part or module requires a particularly high degree of high temperature stability, the cure cycle will be carried out at a higher temperature.

The following examples will illustrate the practice of the invention and are not to be taken as limiting in any way.

*Example I*

A computer logic element consisting of germanium transistors, germanium diodes, carbon resistors, and miniature ceramic capacitors in circuit was encapsulated in a mold made of silicone rubber having a capacity of about 0.25 cubic inch. The mold assembly was preheated for about 20 minutes at 50° C., the electronic elements being in place within the mold. The material of the preferred composition described above was poured into the mold and cured for two hours at 50° C. The cured material was removed from the mold when sufficiently cooled for handling, and was post-cured for two hours at 65° C. A clear encapsulated assembly or module was obtained.

*Example II*

Electronic components comprising magnetic cores, germanium diodes, mica capacitors, carbon resistors, and a wire wound iron core choke in circuit were encapsulated in a mold having a capacity of about 0.30 cubic inch. The mold assembly was preheated for 20 minutes at 50° C. After the resin composition of the preferred type was added, the material was cured for two hours at 45° C., removed from the mold when handleable, and post-cured for two hours at 50° C., to again produce a clear, self-contained module.

*Example III*

In this case, computer logic elements and shift register bases consisting of terminal pins set in the mold to form a pallet which holds the components during the assembly operation were molded or encapsulated in a blank mold having a capacity of about 0.04 cubic inch, the mold being preheated for about 20 minutes at 65° C. After the resinous material of the preferred composition was added to the mold containing elements, the assembly was cured for two hours at 65° C., removed from the mold when sufficiently cool, and post-cured for two hours a 105° C.

All of the above examples produced materials which were substantially clear or transparent and possessed of good electrical and physical properties. It will be noted that in the case of Example III, where the components for a particular application required a greater resistance to high temperatures, the post-cure temperature and the curing temperature were somewhat higher than those used for the other elements not requiring such a high degree of high temperature resistance.

*Example IV*

Electronic components consisting of germanium diodes, germanium transistors, carbon resistors, ceramic capacitors, and silicon diodes in circuit were encapsulated in a blank mold having a capacity of 0.3 cubic inch using the preferred material as described above. The cure cycle was two hours at 50° C. with a post-cure of two hours at 55° C. The specific gravity of the resinfied material was 1.21 at 23° C., the pot life of the unresinified material used was about 1¾ hours at 23° C., and the viscosity was 464 centipoises at 23° C. The exotherm measured at an ambient temperature of 50° C. of 4 grams of the above material was 59° C., and of 8 grams, 78° C. The hardness of the finally cured material was 20, Barcol Hardness Number.

The samples used in testing the material were made as specified in the Military Specification MIL–1–16923C. The linear shrinkage was .004 inch/inch when calculated over a 6 inch specimen. The material was found to be self-extinguishing when tested according to Method 2021 of Federal Specification LP 406B. Heat resistance of the material was 0.076% after 7 days at 105° C. and there was a slight yellowing effect on the plastic. Thermal shock properties of the material were tested to the same specification and were found to be suitable. A moisture absorption test was carried on for 10 days with a relative humidity of 96% at room temperature and was found to be 0.53%. The material passed the mechanical shock test at 3.5 pounds. The heat distortion temperature of the material was 63° C. when tested according to A.S.T.M. Method D–648–45T. The water vapor permeability when tested according to the Military Specification was $16.7\times10^{-6}$ grams/hour/centimeter. The dielectric strength was in excess of 325 volts per mil and the dielectric constant of the material was 3.95. The volume and surface resistivity were tested and found to be in excess of $10^{13}$ ohm-cm. The machinability of the plastic material was very good and the material could be buffed and polished to a beautiful finish. All of the above properties were tested according to the Military Specification MIL–1–16923C Type B or the Federal Specification LP 406B, as referred to by the Military Specification.

The four examples just described met all of the requirements of the Military and Federal Specifications noted above, and were found extremely satisfactory. On the other hand, test modules made utilizing the same epoxy resins, but with different or varying amounts of curing agents and flame retarders, or using epoxy resins with a different epoxide equivalent, were found deficient in one or more properties. The following examples are illustrative of modules formed with formulations using materials different from, or outside the ranges of, those disclosed by this invention.

*Example V*

A module was formed utilizing the same conditions as in Example I, except that 13 parts of metaxylylene diamine were utilized as the curing agent. Following the post-cure treatment, it was found that the module had insufficiently cured. This was determined to result from an absence of thermal cross-linking.

*Example VI*

The procedure of Example II was followed with a mold having a capacity of about 1.25 cubic inch. 16 parts of metaxylylene diamine were used for each 100 parts of epoxy resin. While the treatment resulted in a cured resin, the resultant module was not clear, having a pronounced amber color. Subsequent tests using from 17 to 20 parts of metaxylylene diamine per 100 parts of epoxy resin yielded modules having a dark yellow to brown color.

*Example VII*

The procedure of Example I was again followed, except that diethylene triamine was utilized as the curing agent. A check of the module following the post-cure revealed that the plastic was not water white. While the plastic was not completely hazy, it approached haziness and thus did not have the clarity required of the module of the present invention. Similar results were noted using triethylenetetramine, meta-phenylene diamine, and various Versamids.

*Example VIII*

A sample was prepared from 100 parts Epon 828, 14.5 parts metaxylylene diamine, and 6.5 parts tris-beta chlorethyl phosphate. The mold was approximately 4 inches long and had a cross section of about 1 square inch. Following the post-cure treatment, the plastic was tested for flame resistance according to Federal Specification LP 406B. A flame was applied, and on removal the plastic continued to burn throughout the 4-inch length. In contrast, a similar sample utilizing at least 7 parts tris-beta chlorethyl phosphate per 100 parts Epon 828 stopped burning after the flame has traversed a distance of about 1 inch.

*Example IX*

The procedure of Example I was again followed utilizing about 9.5 parts tris-beta chlorethyl phosphate per 100 parts of epoxy resin. A test of the module following post-curing revealed a lower dielectric strength and volume resistivity than required. The volume resistivity of this material was approximately $10^{11.5}$ ohm-cm. Further tests made utilizing up to 12 parts tris-beta chlorethyl phosphate per 100 parts epoxy resin showed a further decrease in volume resistivity to about $10^{10}$ ohm-cm.

*Example X*

A module was formed according to the method of Example I except that an Aroclor, a polychlorinated polyphenyl produced by the Monsanto Chemical Company, was substituted for the tris-beta chlorethyl phosphate. Following post-curing, the module was found to have a lower volume resistivity, a lower dielectric strength, and a higher dielectric constant than required by the Military Specification.

*Example XI*

A module was formed according to the procedure employed in Example I, with the exception that antimony trioxide was substituded for the tris-beta chlorethyl phosphate as a flame retarder. The finally cured product was cloudy and thus, the clear, water white module desired was not formed.

From the above, it will be noted that the materials formed utilizing the compounds and percentages specified are possessed of many desirable characteristics. The material before resinification has a low viscosity and a desirable pot life. The thermal, mechanical, and moisture resisting properties are very good, making it an excellent, low-temperature curing material. It will be particularly noted that the electrical properties are still good, despite the addition of a plasticizing material, such as tris-beta chlorethyl phosphate, since plasticizers in general degrade such electrical properties. The self-extinguishing property of the material is particularly desirable in cases where the module may be exposed to flame at any time, and again this very desirable property has been obtained without degrading the module in other respects. On the other hand, it can be seen from Examples V–XI that utilizing either the metaxylylene diamine or tris-beta chlorethyl phosphate outside the specified ranges, or substituting other well-known epoxy curing agents and well-known flame retardants, will result in a degradation of at least one of the desired properties. The modules provided by the preferred composition are particularly desirable in that they are clear, physically rugged, moisture resistant, and readily manufactured for both original equipment and replacement purposes.

What I claim as new and desire to secure from Letters Patent of the United States is:

1. A substantially clear, self-extinguishing encapsulating resinous composition consisting essentially of by weight, 100 parts epoxy resin, said resin having more than one epoxy group per molecule and having an epoxide equivalent from 173 to 205, 13.5 to 15.5 parts metaxylylene diamine and 7 to 9 parts tris-beta chlorethyl phosphate.

2. A substantially clear, self-extinguishing encapsulating resin consisting essentially of by weight, 100 parts epoxy resin, said resin having more than one epoxy group per molecule and having an epoxide equivalent from 173 to 205, 14.5 parts metaxylylene diamine and 8 parts tris-beta chlorethyl phosphate.

3. An electronic module containing at least one electronic component embedded in a substantially clear, resinous composition consisting essentially of, by weight, 100 parts epoxy resin, said resin having more than one epoxy group per molecule and having an epoxide equivalent from 173 to 205, 13.5 to 15.5 parts metaxylylene diamine and 7 to 9 parts tris-beta chlorethyl phosphate.

4. An electronic module containing a plurality of electronic components embedded in a substantially clear, resinous composition consisting essentially of, by weight, 100 parts epoxy resin, said epoxy resin having more than one epoxy group per molecule and having an epoxide equivalent from 173 to 205, 13.5 to 15.5 parts metaxylylene diamine and 7 to 9 parts tris-beta chlorethyl phosphate, said module having means for connecting said electronic components in circuit with other components.

5. An electronic circuit encapsulated in a substantially clear, self-extinguishing, resinous material having an exotherm upon resinification which is not harmful to said circuit, said material consisting essentially of, by weight, 100 parts epoxy resin, said resin having more than one epoxy group per molecule and having an epoxide equivalent from 173 to 205, 13.5 to 15.5 parts metaxylylene diamine and 7 to 9 parts tris-beta chlorethyl phosphate.

References Cited by the Examiner

UNITED STATES PATENTS

| | | | |
|---|---|---|---|
| 2,862,992 | 12/1958 | Franz | 174—52.6 |
| 2,918,439 | 12/1959 | Phillips et al. | 260—2 |
| 2,956,037 | 10/1960 | Venable | 260—2.5 |

OTHER REFERENCES

Lee et al.: "Epoxy Resins, Their Applications and Technology," McGraw-Hill Book Company, Inc., New York, 1957, pages 202–204, TP 986.E6L4C.3.

Skeist: "Epoxy Resins," Reinhold Publishing Corporation, New York, 1958, page 236, TP 986.E6 S52.

MORRIS LIEBMAN, *Primary Examiner.*

B. A. AMERNICK, *Assistant Examiner.*